United States Patent [19]
Diaz

[11] Patent Number: 5,333,203
[45] Date of Patent: Jul. 26, 1994

[54] REVERB AND SELECTABLE TREMOLO AND VIBRATO ELECTRON TUBE PREAMPLIFIER

[76] Inventor: Cesar Diaz, 473 N. Courtland St., East Stroudsburg, Pa. 18301

[21] Appl. No.: 887,614

[22] Filed: May 22, 1992

[51] Int. Cl.[5] .............................................. H03G 3/00
[52] U.S. Cl. ........................................ 381/62; 381/63; 381/64; 84/705; 84/706; 84/707
[58] Field of Search ...................... 381/62, 64; 84/705, 84/706, 707, 739, 63, 740

[56] References Cited

U.S. PATENT DOCUMENTS

| | | | |
|---|---|---|---|
| 2,318,417 | 5/1943 | Phelps | 381/64 |
| 2,534,342 | 12/1950 | Daniel | 381/62 |
| 2,817,708 | 12/1987 | Fender | 381/62 |
| 2,892,372 | 6/1959 | Bauer | 381/62 |
| 2,967,909 | 1/1961 | Rice | 381/62 |
| 3,076,370 | 2/1963 | Williams | 381/62 |
| 3,388,257 | 6/1968 | Ten Eyck | 381/62 |
| 3,413,403 | 11/1968 | Jacob | 84/739 |
| 3,431,358 | 3/1969 | Goncharoff | 381/64 |
| 3,492,425 | 1/1970 | Evans | 381/62 |

Primary Examiner—Forester W. Isen
Attorney, Agent, or Firm—Thomas R. Morrison

[57] ABSTRACT

A preamplifier device employing electron tubes wherein the preamplifier has tremolo/vibrato circuits independent from reverb circuits allowing continuously variable control of either tremolo or vibrato effects simultaneous with continuously variable control of the reverb effect. A mixer control for controlling the level of reverb and a tone control is provided. Connections are provided for external switches used to disable any one of the above effects.

17 Claims, 4 Drawing Sheets

REVERB AND SELECTABLE TREMOLO AND VIBRATO ELECTRON TUBE PREAMPLIFIER

BACKGROUND OF THE INVENTION

The present invention relates to audio preamplifiers, and more particularly, to audio preamplifiers of electron tube construction having reverb, tremolo, and vibrato effects.

Electron tube preamplifiers offer combinations of features including reverb, tremolo and vibrato effects. Also, electron tube power amplifiers offer combinations of these effects. The available amplifiers offer various subsets of the above features. However, a need exists for a preamplifier of electron tube construction wherein the tremolo and vibrato effects may be alternately selected and independent reverb simultaneously mixed into the output signal.

Typically, electron tube preamplifiers and power amplifiers having reverb effects are large and thus difficult to carry. The need for a compact electron tube preamplifier having reverb, tremolo and vibrato effects currently exists.

Preamplifiers employing solid state construction offer features including reverb, tremolo and vibrato effects. While such solid state preamplifiers offer combinations of the above features, they do not provide the audio characteristics of electron tube amplifiers sought after by musical artists. Furthermore, such amplifiers do not generally offer continuously variable control over the characteristics of the effects and instead offer fixed preset levels thus limiting the artist's range of expression.

Finally, some musical artists express a preference for amplifiers of "vintage" electron tube design which typically do not offer the variety of effects discussed above. While a preamplifier of solid state construction would be capable of introducing the above combination of effects for use with an electron tube amplifier, its use would conflict with the artist's preference for electron tube amplifiers, their characteristics and their appeal. Thus, a need exists for an electron tube preamplifier having reverb, tremolo, and vibrato effects usable in conjunction with electron tube amplifiers.

OBJECTS AND SUMMARY OF THE INVENTION.

Accordingly, it is the object of the invention to provide a preamplifier having a combination of features that are not available in the prior art.

Furthermore, it is an object of the invention to provide an electron tube preamplifier having reverb, tremolo, and vibrato effects, wherein the reverb effect may be used simultaneously with either the tremolo or vibrato effect.

Additionally, it is the object of the invention to provide an electron tube preamplifier having a reverb circuit that operates independent of tremolo and vibrato circuits.

It is an object of the invention to provide an electron tube preamplifier having continuously variable control over characteristic aspects of reverb, tremolo, or vibrato sound effects. Such characteristic aspects include dwell and a mixed level in the case of reverb, and speed and depth in the case of tremolo and vibrato effects.

Another object of the invention is to provide an electron tube amplifier wherein reverb, tremolo and vibrato effects may each be disabled via external switches.

Still further, it is an object of the invention to provide the above features in a unit that is smaller than the prior art, thereby allowing ease of carrying.

Briefly stated, the present invention provides a preamplifier device employing electron tubes wherein the preamplifier has first effect and second effect circuits independent from reverb circuits allowing continuously variable control of either reverb effect or first and second effects simultaneous with continuously variable control of the reverb effect. A mixer control for controlling the level of reverb and a tone control is provided. Connections are provided for external switches used to disable each of the above effects. The first and second effects may be tremolo and vibrato effects.

Accordingly the invention includes an electron tube preamplifier for conditioning an input audio signal comprising: means for producing a reverb effect upon the input audio signal thus creating a reverb effect output signal; means for modulating the input audio signal and the reverb effect output signal such that a selected effect that is one of a tremolo effect and a vibrato effect is imposed upon a modulated output signal; means for receiving the input audio signal and applying it to the means for producing a reverb effect and the means for modulating; the means for modulating being such that the modulated output signal contains an amount of the reverb effect.

Furthermore, the invention includes an electron tube preamplifier for conditioning an input audio signal comprising: means for producing a reverb effect upon the input audio signal thus creating a reverb effect output signal comprising: a reverb tank having an output at which the reverb effect output signal is produced; and a variable gain amplifier circuit for driving an input of the reverb tank; the variable gain amplifier having a gain adjustment for setting a level of dwell of the reverb effect; and means for modulating the input audio signal and the reverb effect output signal such that the reverb effect and a selected effect that is one of a tremolo effect and a vibrato effect is imposed upon a modulated output signal wherein the means for modulating comprises: a controllable resistance responsive to the oscillator output signal; the controllable resistance having a resistance range adjustment for varying a depth of the tremolo and the vibrato effects; and the modulation circuit being responsive to the oscillator output signal via the controllable resistance; the means for modulating being such that the modulated output signal contains an amount of the reverb effect; and means for receiving the input audio signal and applying it to both the means for producing a reverb effect and the means for modulating.

Yet another embodiment of the invention includes an electron tube preamplifier for conditioning an input audio signal comprising: means for modulating the input audio signal such that a selected effect that is one of a first effect and a second effect is imposed upon a modulated output signal; wherein the means for modulating comprises: an oscillator circuit; and a modulation circuit responsive to an oscillator output signal of the oscillator circuit and having a switch for selecting one of the first and the second effects; the modulation circuit being such that a selected effect that is one of the first effect and the second effect is imposed upon the modulated output signal; means for receiving the input audio signal and applying it to the means for modulating.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
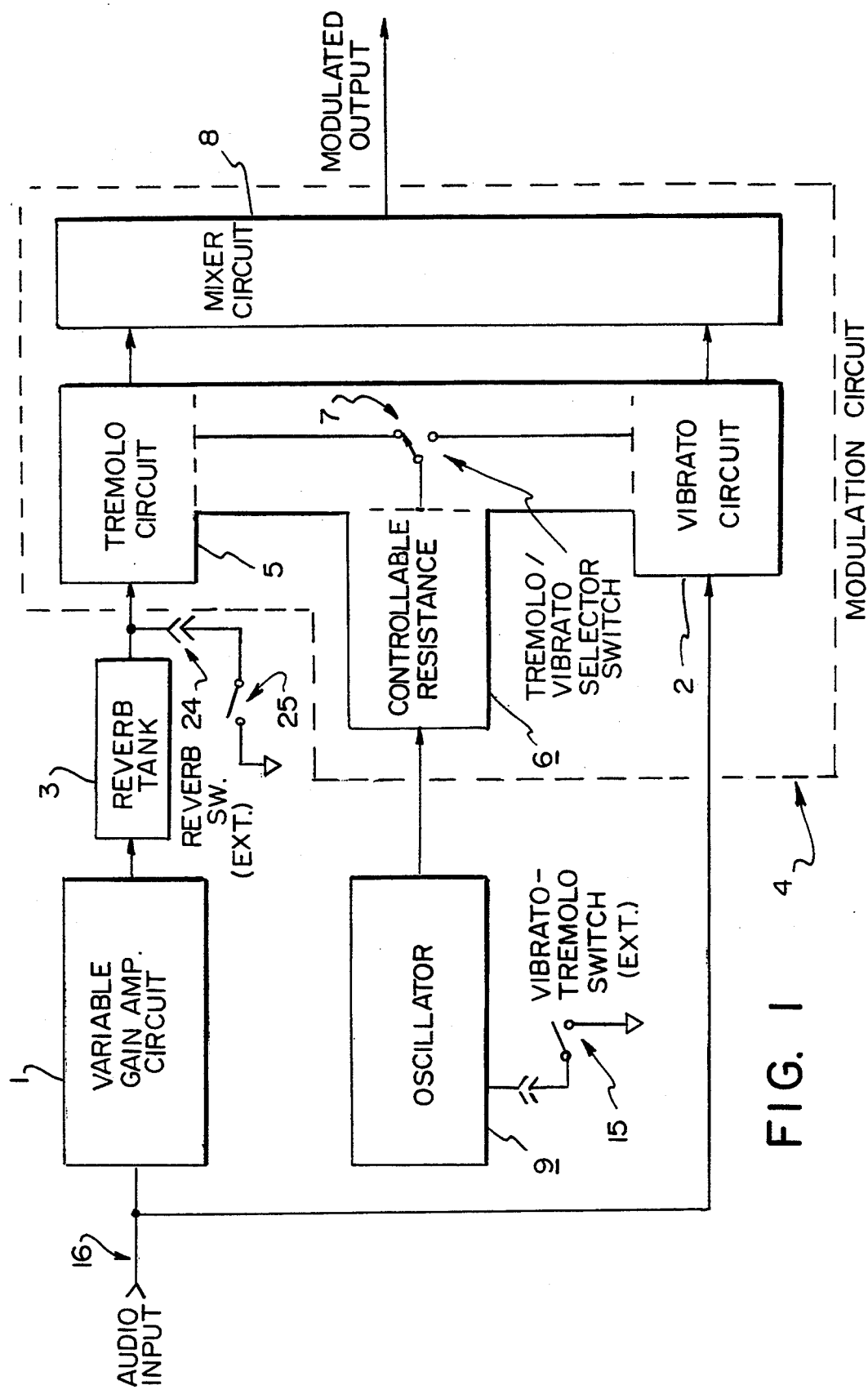
FIG. 1 is a block diagram of the electron tube preamplifier.

Referring to the block diagram of FIG. 1, an audio input signal is applied to the input of a variable gain amplifier 1 and the input of a vibrato circuit 2. The audio input signal is amplified by the variable gain amplifier 1 and the output of the variable gain amplifier 1 is applied to a reverb tank 3. The reverb tank 3 adds a reverb effect to the amplified audio input signal producing a reverb effect output signal which is then applied to the input of a tremolo circuit 5 in a modulation circuit 4. The dwell of the reverb effect is determined by the gain of the variable gain amplifier 1. A higher amount of gain results in a longer dwell of the reverb effect due to the increased power applied to the reverb tank 3.

The modulation circuit 4 comprises the vibrato circuit 2, the tremolo circuit 5, and a mixer circuit 7. The tremolo circuit 5 and the vibrato circuit 2 share a controllable resistance 6 and a tremolo/vibrato selector switch 7. The output of the tremolo circuit 5 having a reverb effect and the output of the vibrato circuit 2 are both input to a mixer circuit 8 which mixes the two outputs together to produce the final modulated output of the electron tube preamplifier.

The modulation circuit 4 is responsive to an oscillator output signal supplied by an oscillator 9. The controllable resistance 6 is the element of the modulation circuit 4 that is responsive to the oscillator output signal and in turn induces modulation of the modulated output signal appearing at the output of the mixer circuit 8 via one of the tremolo circuit 5 and the vibrato circuit 2 depending upon the position of the tremolo/vibrato selector switch 7.

The mixer circuit 8 variably combines the outputs of the tremolo circuit 5 and the vibrato circuit 2 and in doing so controls the level of reverb effect in the modulated output because the reverb effect passes through the tremolo circuit and appears in the tremolo circuit output.

The configuration in FIG. 1 results in a preamplifier having a reverb effect and a tremolo/vibrato effect wherein the reverb circuitry operates independently of the tremolo and vibrato.

Figure 2:
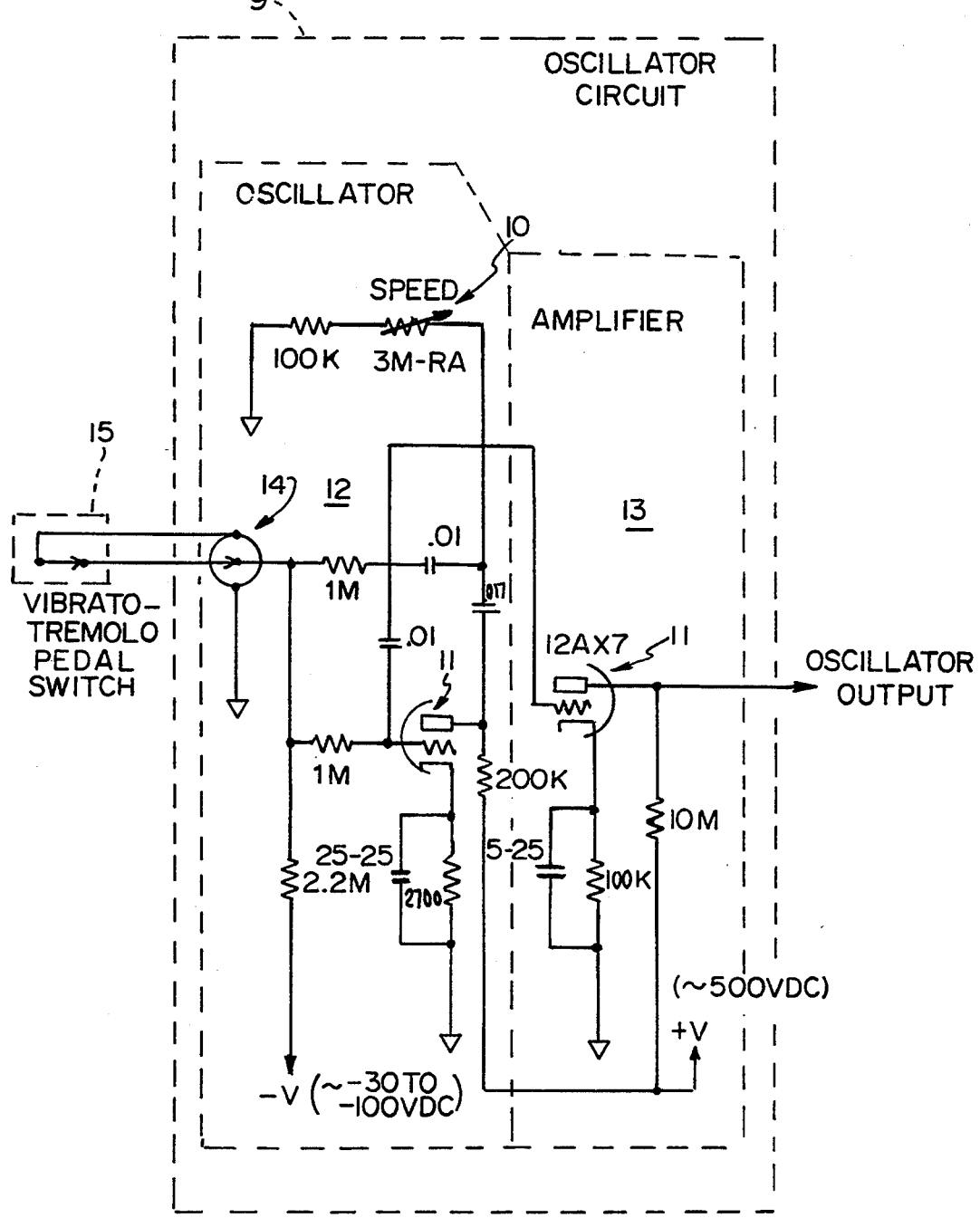
FIG. 2 is a detailed schematic of the oscillator circuit embodied in the electron tube preamplifier circuitry.

In FIG. 2 the oscillator circuit 9 is shown in detail. The oscillator circuit 9 has a frequency adjustment consisting of a variable resistor 10 for varying the frequency of the oscillator output signal and thus the speed of the vibrato or tremolo effect. The oscillator utilizes an electron tube 11 of the twin triode variety as an active element. One triode is used in an oscillator 12 while the other is used in an amplifier circuit 13 to provide the oscillator output signal of such a magnitude so as to drive the modulation circuit 4, shown in FIG. 1. A connector 14 is provided so that an external vibrato-tremolo switch may be connected. The vibrato-tremolo switch when closed causes the oscillator to cease oscillating and thus turns off the vibrato and the tremolo effect. The vibrato-tremolo switch provides a remote means for controlling the electron tube preamplifier.

Figure 3:
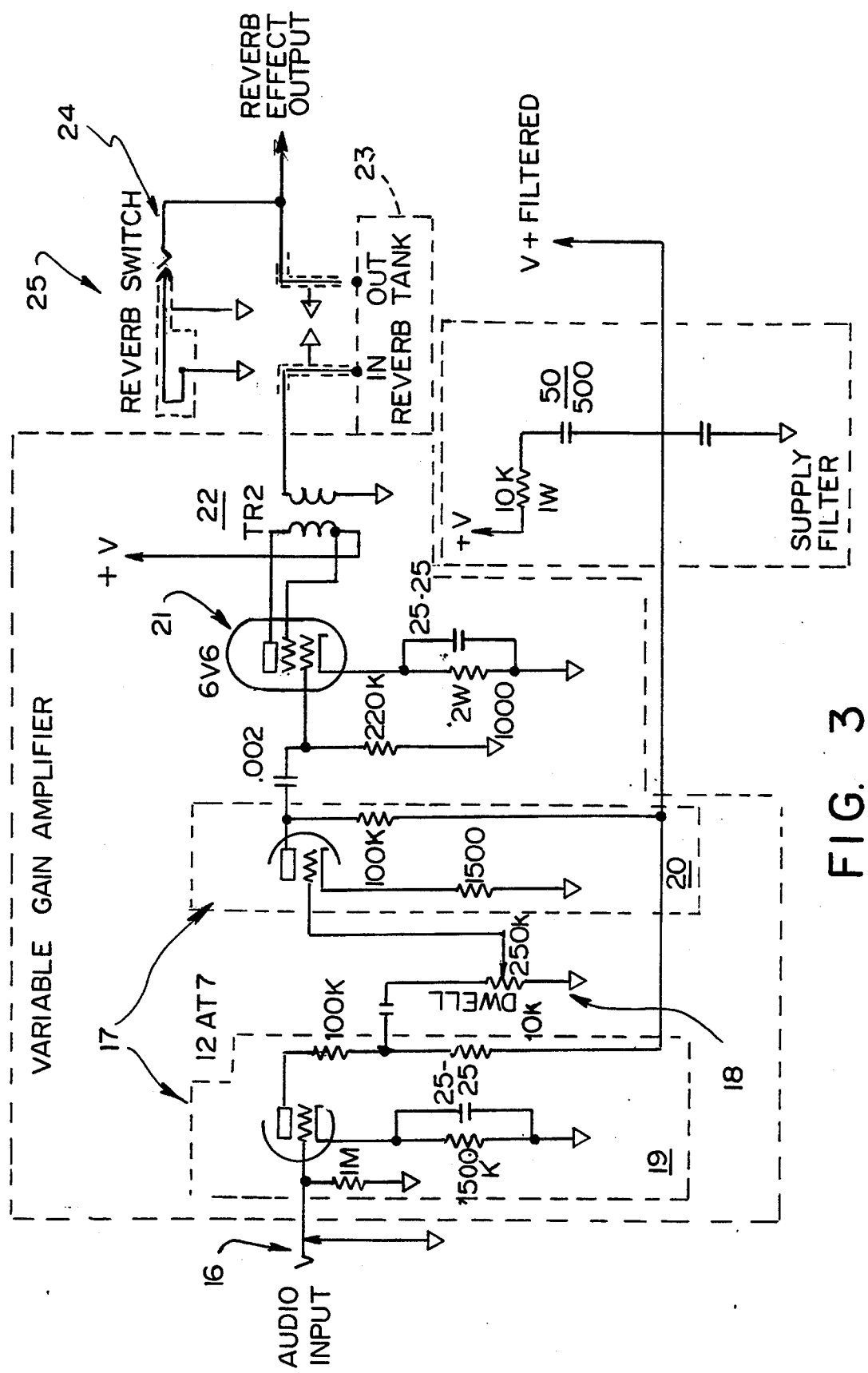
FIG. 3 is a detailed schematic of the reverb section of the electron tube preamplifier circuitry.

Referring now to FIG. 3, a detailed schematic of the variable gain amplifier 1 is shown. An audio input signal is applied to the audio input of the variable gain amplifier 1. A first stage 19 of the variable gain amplifier utilizes one half of a twin triode electron tube 17 and drives a potentiometer 18 with its output. The wiper of potentiometer 18 is connected to the input of a second stage 20 of the variable gain amplifier 1. The potentiometer 18 serves as a gain adjustment and thus controls the dwell of the reverb effect. The output stage 22 of the variable gain amplifier 1 utilizes transformer TR2 to couple its output to the reverb tank 23. The reverb tank 23 then adds the reverb effect to the output stage output with a reverb effect output signal appearing at the output of the reverb tank 23. A jack 24 is connected to the output of the reverb tank 23 so that an external reverb switch 25 may be used remotely to turn off the reverb effect by grounding the output of the reverb tank 23.

Figure 4:
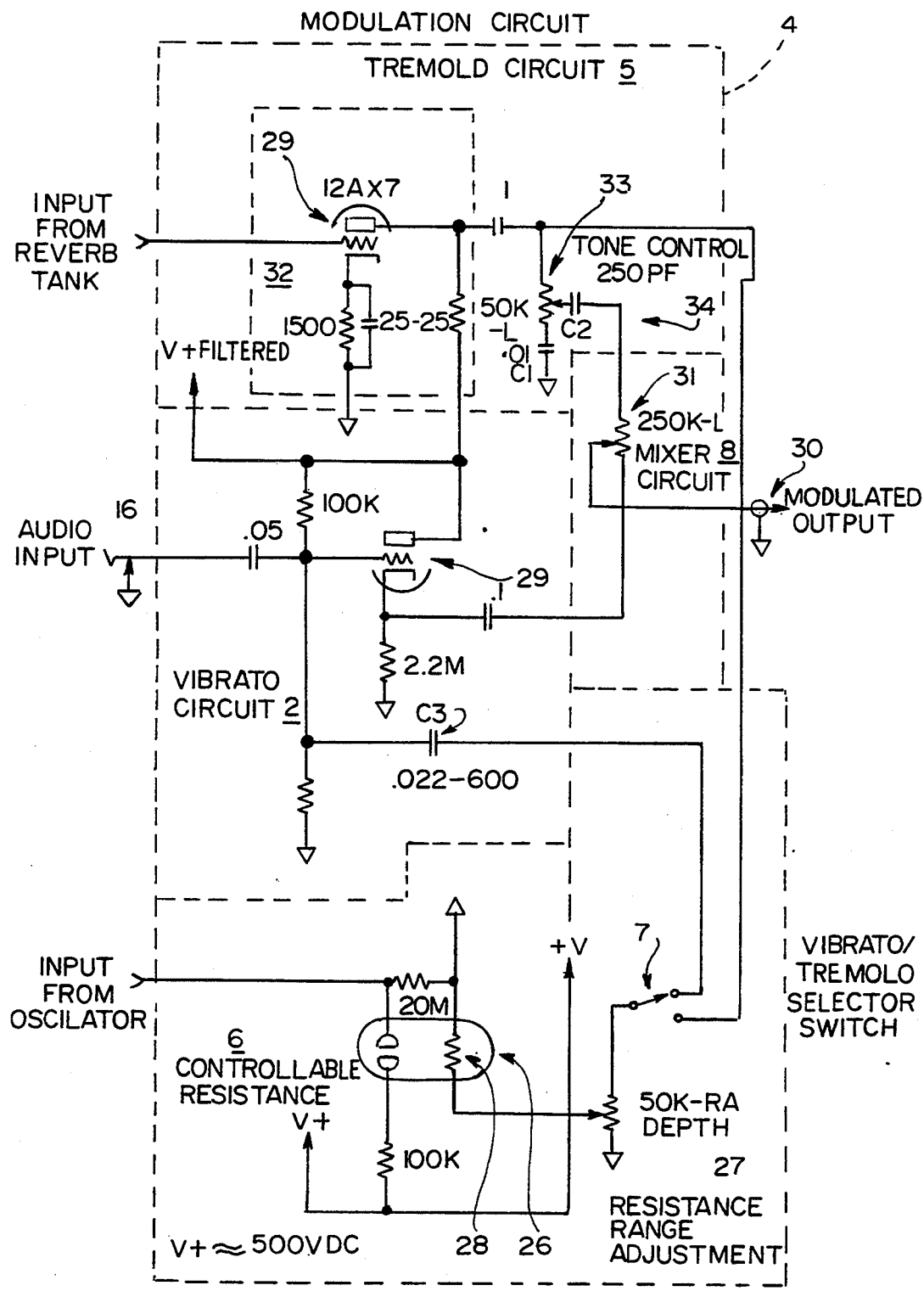
FIG. 4 is a detailed schematic of a modulation circuit in the electron tube preamplifier circuitry showing the circuitry of a controllable resistance, a tremolo circuit, a vibrato circuit, and a mixer.

FIG. 4 shows a detailed schematic of the modulation circuit. The controllable resistance 6 includes an opto-isolator gas discharge tube 26 and a potentiometer 27. The oscillator output signal is applied to the input of the controllable resistance and drives the opto-isolator gas discharge tube 26. The photo-resistive element 28 of the opto-isolator gas discharge tube 26 has a resistance that varies with the photon emissions of the opto-isolator gas discharge tube 26. The resistance characteristic with respect to time is generally sawtooth in nature, with the period of the sawtooth characteristic coinciding with a firing of the opto-isolator gas discharge tube. One side of this photo-resistive element 28 is connected to ground and at the other side it is connect to the wiper of potentiometer 27. The potentiometer 27 has a first terminal connected to ground and a second terminal connected to the pole of vibrato/tremolo selector switch 7. Varying the wiper position changes the range of variation of the controllable resistance to ground at the second terminal. The potentiometer 27 thus serves as a resistance range adjustment and thereby controls the depth of the tremolo and vibrato effects. It has been found that the use of a potentiometer with a reverse audio taper as potentiometer 27 lends itself well to the control of the vibrato effect. However, the invention does not limit itself to this type of potentiometer. The vibrato/tremolo selector switch 7 connects the controllable resistance to one of the tremolo circuit 5 and the vibrato circuit 2 thus determining which effect is produced.

The vibrato circuit 2 utilizes half of a twin triode electron tube 29 as an active element in a cathode follower amplifier. The controllable resistance 6 is capacitively coupled via C3 to a control grid of the cathode follower amplifier loading the bias circuit and the audio input signal applied to the audio input 16 thus creating a modulated output at the output of the cathode follower amplifier and thus a vibrato effect.

The vibrato effect comprises both distortion and clipping of the modulated output thus introducing harmonic frequencies of the input audio signal and thus a fluctuation in the harmonic content of the modulated output so as to introduce what is perceived to be shimmering of upper frequencies of the audio spectrum while introducing a lesser amount of this effect upon lower frequencies of the audio spectrum.

The selection of the value of C3 controls the quality of the vibrato effect and may be varied to achieve a desired range of distortion and clipping. Generally, a value of 0.022 microfarads in conjunction with the associated circuitry, provides an even balance of the vibrato effect across the audio spectrum as a listener perceives the effect. However, while a value of 0.022 microfarads provides a balance as stated, values in the range of 0.01–0.1 microfarads may be employed to achieve a desired balance. Lower values of capacitance accentuate the effect in the upper frequency range of the audio spectrum. Although a range of capacitance has been noted, it is understood that it is the time constants of the bias circuit that are created due to the controllable resistance that are of importance in achieving the desired effect.

When modulation is not applied, the cathode follower serves as low output impedance buffer for the audio input signal so that it may then be mixed in the mixer circuit with the reverb effect present at the output of the tremolo circuit 5.

The mixer circuit 8 controls the desired amount of reverb in the modulated output signal appearing at the modulated output 30 by means of mixer potentiometer 31. Mixer potentiometer 31 has a wiper connected to the modulated output 30, a first terminal connected to the output of the tremolo circuit 5, an output of the vibrato circuit 2. The wiper position determines the levels of the output signals of the tremolo circuit 5, and the vibrato circuit 2 that appear at the modulated output 30 and thus the amount of reverb effect present.

The tremolo circuit 5 includes the second half of the twin tetrode electron tube 29' in an amplifier circuit 32 for amplifying the reverb effect output signal and isolating the reverb tank 23 from the following circuitry. The output of the amplifier circuit 32 is capacitively coupled to a tone control circuit 34 including tone adjustment potentiometer 33, capacitor C1, and capacitor C2. The controllable resistance 6 is selectably coupled via vibrato/tremolo selector switch 7 to a first terminal of the tone adjustment potentiometer 33 where the output of the amplifier circuit is also coupled. A second terminal of the tone potentiometer 33 is coupled to ground via capacitor C1. A wiper of tone potentiometer 33 is capacitively coupled to the first terminal of mixer potentiometer 31 in the mixer circuit 8. The values of mixer potentiometer 31, tone potentiometer 33, capacitor C1, and capacitor C2 are such that the position of the wiper of the tone potentiometer 33 primarily determines the amount of attenuation of higher audio frequencies appearing at the modulated output 30. The value of C2 being chosen so as to have an impedance comparable to the mean impedance of the mixer circuit 8 at a frequency in the mid-range of the audio spectrum. The controllable resistance 6 loads down the output of the amplifier circuit 32 thereby modulating the amplified reverb effect output signal. The controllable resistance 6 also loads the tone potentiometer 33 thereby modulating the attenuation of the tone control circuit 34. A tremolo effect is thus produced upon the modulated output signal.

The tremolo effect produced comprises fluctuation in amplitude of the modulated output signal wherein such fluctuation is perceived to be as substantially even across the audio frequency spectrum.

The electron tube preamplifier as shown in FIGS. 1–4 provides both a reverb effect and a tremolo or vibrato effect. The reverb effect may be used simultaneously with either the tremolo or vibrato effects. Each effect may be turned off via the use of remote switches connected to the electron tube preamplifier. The adjustments for the dwell, speed, depth, and mixer are all continuously variable. Thus a combination of features is provided that is not existing in the prior art.

The electron tube preamplifier along with power supply circuitry is housed in a chassis with dimensions of $18\frac{3}{4}'' \times 8'' \times 7\frac{1}{8}''$. This permits the electron tube amplifier to be more readily transportable than electron tube amplifiers of the prior art having a reverb effect because of their larger dimensions.

Having described a preferred embodiment of the invention with reference to the accompanying drawings, it is to be understood that the invention is not limited to the precise embodiment disclosed, and that various changes and modifications may be effected therein by one skilled in the art without departing from the scope or spirit of the invention defined in the appended claims.

What is claimed is:

1. An electron tube preamplifier for conditioning an input audio signal comprising:
    means for producing a reverb effect upon the input audio signal thus creating a reverb effect output signal;
    a means for modulating said input audio signal and said reverb effect output signal such that said reverb effect and a selected effect that is one of a tremolo effect and a vibrato effect is imposed upon a modulated output signal;
    selection means for permitting said means for modulating to impose one of said tremolo and said vibrato effects upon said input audio signal independently of said reverb effect in said modulated output signal;
    means for receiving the input audio signal and applying it to both said means for producing a reverb effect and said means for modulating; and
    said means for modulating including a control means for providing said modulated output signal with a selectable amount of said reverb effect.

2. The electron tube preamplifier as recited in claim 1 wherein:
    said means for modulating includes an oscillator circuit and a modulation circuit responsive to an oscillator output signal of said oscillator circuit and having a switch for selecting one of said tremolo and said vibrato effects; and
    said modulation circuit being such that said reverb effect and a selected effect that is one of a tremolo effect and a vibrato effect is imposed upon said modulated output signal.

3. The electron tube preamplifier as recited in claim 2 further comprising:
    said oscillator circuit having a frequency adjustment for varying a speed of said vibrato and said tremolo effect;

said modulation circuit including a controllable resistance responsive to said oscillator output signal;

said controllable resistance having a resistance range adjustment for varying a depth of said tremolo and said vibrato effects; and said modulation circuit being responsive to said oscillator output signal via said controllable resistance.

4. The electron tube preamplifier as recited in claim 3 wherein the modulation circuit includes:

a tremolo circuit for producing said tremolo effect upon said reverb effect output signal and said modulated output signal including said input audio signal;

said tremolo circuit having said oscillator output signal as a modulating input;

a vibrato circuit for producing said vibrato effect upon said audio input signal having said oscillator output signal as a modulating input; and said control means of said modulation circuit including a mixing circuit for variably mixing a buffered reverb effect output at a tremolo circuit output with a vibrato circuit output thus adjusting said amount of reverb effect present in said modulated output signal.

5. The electron tube preamplifier as recited in claim 3 wherein the vibrato circuit comprises:

an electron tube cathode follower circuit having a control grid;

said controllable resistance and the input audio signal being capacitively coupled to said control grid thus imposing said vibrato effect upon a vibrato circuit output;

said vibrato circuit output being applied to a first mixer input of said mixing circuit; and said controllable resistance being capacitively coupled to said control grid via said switch for selecting.

6. The electron tube preamplifier as recited in claim 5 wherein the tremolo circuit comprises:

an electron tube amplifier circuit having an amplifier input;

said reverb effect output signal being applied to said amplifier input;

said electron tube amplifier circuit having an output coupled to said mixing circuit at a second mixer input;

said controllable resistance being connected to said second mixer input and said electron tube amplifier circuit output via said switch for selecting;

said controllable resistance loading the electron tube amplifier circuit and the mixing circuit so as to modulate an amplified reverb effect signal and said input audio signal supplied by said vibrato circuit output thus producing a tremolo circuit output having said tremolo effect in said mixing circuit; and said mixing circuit mixing said tremolo circuit output with said amplified reverb effect signal so as to provide said amount of said reverb effect in the modulated output signal.

7. The electron tube preamplifier as recited in claim 6 wherein the means for producing a reverb effect comprises:

a reverb tank having an output at which said reverb effect output signal is produced;

a variable gain amplifier circuit for driving an input of said reverb tank; and said variable gain amplifier having a gain adjustment for setting a level of dwell of said reverb effect.

8. The electron tube preamplifier as recited in claim 7 comprising:

said mixing circuit including a tone control circuit for adjusting a frequency response characteristic of the modulated output; and said tone control circuit being loaded by said controllable resistance so as to produce said tremolo effect.

9. The electron tube preamplifier as recited in claim 8 utilizing an external vibrato and tremolo switch comprising:

a means for connecting said external vibrato and tremolo switch so as to switch one of said vibrato and tremolo effects on and off depending upon a position of said switch for selecting.

10. The electron tube preamplifier as recited in claim 9 utilizing an external reverb switch comprising:

a means for connecting said external reverb switch so as to switch said reverb effect on and off.

11. The electron tube preamplifier as recited in claim 8 comprising a reverb switch including a means for connecting said external reverb switch so as to switch said reverb effect on and off.

12. An electron tube preamplifier as recited in claim 3 wherein said controllable resistance includes an optoisolator of the gas discharge tube variety.

13. The electron tube preamplifier as recited in claim 4 wherein the tremolo circuit further comprises:

an electron tube amplifier circuit having an amplifier input;

said reverb effect output signal being applied to said amplifier input;

said electron tube amplifier circuit having an output coupled to said mixing circuit at a mixer input;

said controllable resistance being connected to said mixer input and said electron tube amplifier circuit output via said switch for selecting;

said controllable resistance loading the electron tube amplifier circuit and the mixing circuit so as to modulate an amplified reverb effect signal thus producing said tremolo effect; and said mixing circuit mixing said tremolo circuit output with said amplified reverb effect signal so as to provide said amount of said reverb effect in the modulated output signal.

14. The electron tube preamplifier as recited in claim 13 wherein said means for producing a reverb effect comprises:

a reverb tank having an output at which said reverb effect output signal is produced;

a variable gain amplifier circuit for driving an input of said reverb tank; and said variable gain amplifier having a gain adjustment for setting a level of dwell of said reverb effect.

15. The electron tube preamplifier as recited in claim 3 wherein:

said frequency adjustment is continuously variable; and said resistance range adjustment is continuously variable.

16. An electron tube preamplifier for conditioning an input audio signal comprising:

reverb means for producing a reverb effect upon the input audio signal thus creating a reverb effect output signal; and said reverb means including a reverb tank having an output at which said reverb effect output signal is produced and a variable gain amplifier circuit for driving an input of said reverb tank;

said variable gain amplifier having a gain adjustment for setting a level of dwell of said reverb effect;

means for independently receiving and modulating said input audio signal and said reverb effect output signal such that said reverb effect and a selected effect that is one of a tremolo effect and a vibrato effect is imposed upon a modulated output signal:

said means for modulating including a controllable resistance responsive to an oscillator output signal;

said controllable resistance having a resistance range adjustment for varying a depth of said tremolo and said vibrato effects;

said means for modulating including a modulation circuit responsive to said oscillator output signal via said controllable resistance;

said means for modulating being such that said modulated output signal contains an amount of said reverb effect; and means for receiving the input audio signal and applying it to both said means for producing a reverb effect and said means for modulating.

17. An electron tube preamplifier for conditioning an input audio signal comprising:

means for modulating the input audio signal such that a selected effect that is one of a first effect and a second effect is imposed upon a modulated output signal;

said means for modulating including an oscillator circuit and a modulation circuit responsive to an oscillator output signal, of the oscillator circuit, and having a switch for selecting one of the first and the second effects;

said modulation circuit imposing a selected effect, of the first effect and the second effect, upon the modulated output signal;

said modulation circuit including a tremolo circuit having a manually variable tone control circuit with resistive loading responsive to said oscillator output signal;

said modulation circuit including a vibrato circuit, parallel to said tremolo circuit, producing a vibrato effect via capacitive loading responsive to said oscillator output signal and operating independently of a setting of said tone control circuit; and means for receiving the input audio signal and applying it to the means for modulating.

* * * * *